United States Patent
Josan et al.

(10) Patent No.: US 7,592,806 B2
(45) Date of Patent: Sep. 22, 2009

(54) DOUBLE HALF RF PULSES FOR REDUCED SENSITIVITY TO EDDY CURRENTS IN UTE IMAGING

(75) Inventors: Sonal Josan, Mountain View, CA (US); John M. Pauly, Stanford, CA (US); Kim B. Pauly, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 12/192,347

(22) Filed: Aug. 15, 2008

(65) Prior Publication Data

US 2009/0058418 A1  Mar. 5, 2009

Related U.S. Application Data

(60) Provisional application No. 60/968,828, filed on Aug. 29, 2007.

(51) Int. Cl.
  *G01V 3/00* (2006.01)
(52) U.S. Cl. ...................................... 324/305; 324/309
(58) Field of Classification Search ......... 324/300–324; 600/407–445
  See application file for complete search history.

(56) References Cited

U.S. PATENT DOCUMENTS

| | | | |
|---|---|---|---|
| 5,025,216 A | | 6/1991 | Pauly et al. |
| 5,117,186 A | * | 5/1992 | Burum et al. ............... 324/307 |
| 5,341,098 A | * | 8/1994 | Hennig ....................... 324/309 |
| 6,005,390 A | * | 12/1999 | Watanabe et al. ........... 324/307 |
| 6,288,543 B1 | * | 9/2001 | Listerud et al. ............. 324/309 |
| 7,288,936 B2 | * | 10/2007 | Larson et al. ............... 324/307 |
| 7,477,097 B2 | * | 1/2009 | Bydder et al. ............... 324/307 |
| 2007/0255129 A1 | * | 11/2007 | Du et al. ..................... 600/410 |

OTHER PUBLICATIONS

Josan et al., "Inverted Double Half RF Pulse for Ultrashort T2 Imaging," 6th Interventional MRI Symposium, 2 pages, Sep. 2006.
Josan et al., "Inverted Double Half RF Pulse for Long T2 Suppression in Ultrashort T2 Imaging," Poster presented at Joint Annual Meeting ISMRM-ESMRMB, 2007.
Josan et al., "Inverted Double Half RF Pulse for Long T2 Suppression in Ultrashort T2 Imaging," Abstract, Joint Annual Meeting ISMRM-ESMRMB, 2007.
Josan et al., "Double Half RF Pulses for Reduced Sensitivity to Eddy Currents in UTE Imaging," Mag. Reson. Med., vol. 61(5), pp. 1083-1089, 2009.

* cited by examiner

*Primary Examiner*—Brij B Shrivastav
(74) *Attorney, Agent, or Firm*—Beyer Law Group LLP

(57) ABSTRACT

A method for creating a magnetic resonance image of an object with at least a first species and a second species, wherein the first species has a first $T_2$ time and the second species has a second $T_2$ time longer than the first $T_2$ time is provided. An excitation with an ultra short echo time using a pulse is provided, comprising a first subpulse that creates a transverse magnetization component for the first species and the second species and a second subpulse that creates a transverse magnetization for the first species and substantially returns the second species to a longitudinal axis, wherein the transverse magnetization component substantially decays for the first species during an interval between the first subpulse and the second subpulse. At least one echo is read. A magnetic resonance image is created from the at least one echo.

19 Claims, 8 Drawing Sheets

DOUBLE HALF RF PULSES FOR REDUCED SENSITIVITY TO EDDY CURRENTS IN UTE IMAGING

CROSS REFERENCE TO RELATED APPLICATIONS

This application claims priority under 35 U.S.C. §119 from U.S. Provisional Patent Application No. 60/968,828, filed Aug. 29, 2007, entitled INVERTED DOUBLE HALF RF PULSE FOR ULTRASHORT T2 IMAGING which is incorporated herein by reference for all purposes.

GOVERNMENT RIGHTS

The U.S. government has rights in the disclosed invention pursuant to NIH grants to Stanford University including National Institutes of Health: P41 RR09784 and National Institutes of Health: RO1 CA092061.

BACKGROUND OF THE INVENTION

This invention relates generally to magnetic resonance imaging (MRI). Magnetic resonance imaging (MRI) is a nondestructive method for the analysis of materials and is an approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Magnetic resonance (MR) imaging is based on nuclear spins, which can be viewed as vectors in a three-dimensional space. During an MRI experiment, each nuclear spin responds to four different effects: precession about the main magnetic field, nutation about an axis perpendicular to the main field, and both transverse and longitudinal relaxation. In steady-state MRI experiments, a combination of these effects occurs periodically.

U.S. Pat. No. 5,025,216, to Pauly et al., issued Jun. 18, 1991, entitled Magnetic Resonance Imaging of Short $T_2$ Species, which is incorporated by reference for all purposes, discloses a method for imaging species having short spin-spin relaxation times ($T_2$).

SUMMARY OF THE INVENTION

In accordance with the invention, a method for creating a magnetic resonance image of an object with at least a first species and a second species, wherein the first species has a first $T_2$ time and the second species has a second $T_2$ time longer than the first $T_2$ time is provided. An excitation with an ultra short echo time using a pulse is provided, comprising a first subpulse that creates a transverse magnetization component for the first species and the second species and a second subpulse that creates a transverse magnetization for the first species and substantially returns the second species to a longitudinal axis, wherein the transverse magnetization component substantially decays for the first species during an interval between the first subpulse and the second subpulse. At least one echo is read. A magnetic resonance image is created from the at least one echo.

In another manifestation of the invention a magnetic resonance imaging apparatus is provided. A magnetic resonance imaging excitation and detection system is provided. A controller is electrically connected to the magnetic resonance imaging excitation and detection system and comprises a display, at least one processor, and computer readable media with computer readable code operable to be executed by the controller. The computer readable code comprises computer readable code for providing an excitation with an ultra short echo time using a pulse, comprising a first subpulse that creates a transverse magnetization component for the first species and the second species and a second subpulse that creates a transverse magnetization for the first species and substantially returns the second species to a longitudinal axis, wherein the transverse magnetization component substantially decays for the first species during an interval between the first subpulse and the second subpulse, computer readable code for reading at least one echo, computer readable code for creating an magnetic resonance image from the at least one echo, and computer readable code for displaying the image on the display.

The invention and objects and features thereof will be more readily apparent from the following detailed description and appended claims when taken with the drawings.

DETAILED DESCRIPTION OF ILLUSTRATED EMBODIMENTS

Figures 1A, 1B:
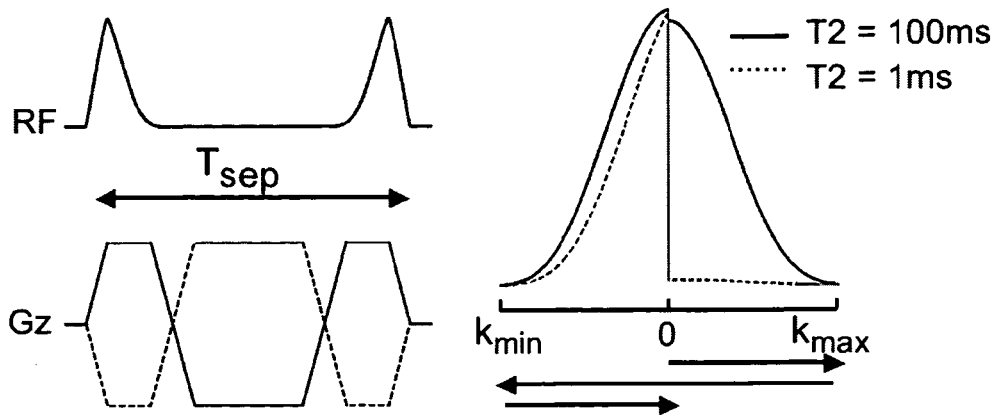
FIGS. 1A-B show a Double Half RF (DHRF) pulse with its slice-select gradient and its k-space trajectory.

Ultrashort echo time imaging with Half RF pulse excitation is challenging, as eddy currents induced by the slice-select gradient distort the half pulse slice profile. An embodiment of the invention provides two pulses with $T_2$-dependent slice profiles that are less sensitive to eddy currents. The double half pulse improves the slice selectivity for long $T_2$ components, while the Inverted Double Half pulse suppresses the unwanted long $T_2$ signal. Thus, both approaches prevent imperfect cancellation of out-of-slice signal from contaminating the desired slice. Experimental results demonstrate substantially improved slice selectivity and R2* quantitation accuracy with these pulses. These pulses are effective in making short $T_2$ imaging and quantitation less sensitive to eddy currents and provide an alternative to time-consuming gradient characterization.

Ultrashort echo time (UTE) imaging is a promising technique for imaging tissues with very short $T_2$ relaxation times (of a few milliseconds or less). There are many potential applications for imaging short $T_2$ species, including musculoskeletal applications (tendons, ligaments, menisci, cortical bone, articular cartilage etc.), lung, plaque, and frozen tissue during cryoablation. These tissues cannot be detected with conventional imaging techniques where TE is limited to a few milliseconds or longer. The achievable echo time for UTE imaging is mainly limited by the transmit/receive switching times of the coils, and is on the order of 8-200 μs, which is much shorter than the shortest TE available on clinical systems. These UTE techniques make it possible to directly image different short $T_2$ tissues. However, robust quantitative assessment of short $T_2$ components in vivo remains challenging. This is primarily due to the difficulty in acquiring $T_2$ data with adequate SNR and without artifacts.

UTE imaging can be implemented by a 3D approach that uses non-selective RF excitation with 3D radial sampling. The non-selective RF excitation used in this technique may require the use of surface or small volume coils to limit the excitation field of view. Alternatively, 2D slice-selective UTE imaging can be performed using a half-sinc RF excitation pulse with radial FID sampling. Two excitations with the slice-select gradient of opposite polarity are applied and the MR signals are added to form the desired slice selection, However, the half-sinc excitation pulse is very sensitive to gradient imperfections such as eddy-current distortions that cause errors in the slice profile. Any distortions in the slice profile will introduce errors in $T_2$ measurements. Several techniques have been proposed to compensate for these eddy current distortions that are based on accurate characterization of gradients and k-space trajectories. These methods are time-consuming, and can be difficult to implement. But these corrections are critical to improve the slice profile for accurate $T_2$* measurement and quantitation.

Each half pulse excitation individually is not very selective, and excites signals far from the intended slice location. In the ideal case, the out-of-slice magnetization from each excitation has an opposite phase and cancels perfectly to form the desired slice selection. In the presence of eddy currents, out-of-slice magnetization does not cancel appropriately when the two excitations are combined, and the magnetization through the slice may not be properly refocused. Spatially invariant $B_0$ eddy currents cause a relative phase offset between the two excitations. Thus when the two excitations are combined, the slice profile is shifted from the desired location and has a sidelobe. Linear eddy currents induce time-varying residual slice select gradients that persist after the end of the half pulse, and cause the phase across the slice to vary over time. These phase errors lead to the spins across the slice being dephased or rephased during the residual gradients. When these gradient errors are compensated with pre-compensated gradient or RF waveforms, the signal decays as expected, but that requires time consuming characterization of gradients. Also, these characterization methods do not calibrate well for the short time constant eddy currents that cause artifacts in UTE imaging.

The signal in UTE images is often dominated by long $T_2$ components, which need to be suppressed to enhance the contrast of the short $T_2$ species. Common approaches to long $T_2$ suppression include multi-echo techniques to subtract the long $T_2$ signal or magnetization preparation RF pulses. The multi-echo approach combines images acquired at different echo times to subtract the long $T_2$ signal and create $T_2$ contrast. The magnetization preparation method typically uses a long low amplitude rectangular RF pulse followed by a dephaser to selectively saturate the long $T_2$ spins. Inversion recovery can also be used to null long $T_2$ components with a particular $T_1$. A higher bandwidth SLR design for saturation pulses or adiabatic inversion pulses can also be used to improve the performance of these preparation pulses with off-resonance.

An embodiment of the invention provides two improved RF pulses that make short $T_2$ imaging and quantitation less sensitive to eddy currents. The double half pulse improves short $T_2$ quantitation by improving the slice profile of the long $T_2$ components so that imperfect cancellation of out-of-slice magnetization does not contribute to the signal. The Inverted Double Half pulse achieves a similar improvement by doing slice selective long $T_2$ suppression while exciting short $T_2$.

Double Half RF Pulse:

A Double Half RF (DHRF) pulse with its slice-select gradient is shown in FIG. 1A. A conventional full-sinc RF pulse is split into two halves separated in time, with the second half of the pulse played out first. The long $T_2$ spins experience both halves of the double half pulse, with little $T_2$ decay during the intervening time $T_{sep}$. The two halves combine in k-space to form essentially a full pulse in each excitation, as shown by the solid-line curve in FIG. 1B, which shows simulated weighting in excitation k-space for two different $T_2$ values. Short $T_2$ spins are excited by the first half pulse, decay during the following time interval $T_{sep}$, and then are excited again by the second half pulse. They effectively experience only a half pulse, as shown by the dashed-line curve. Two excitations with inverted gradients, shown by the dotted line in FIG. 1A, are combined to form the final slice.

The k-space trajectory of this pulse shown in FIG. 1B demonstrates a full-sinc weighting in k-space (symmetric about the origin) for a single excitation for long $T_2$ spins. However, for short $T_2$ spins the pulse amplitude is modulated by $T_2$ decay, so each excitation produces a half-sinc weighting in k-space for short $T_2$. Arrows show the k-space trajectory.

Figure 2:
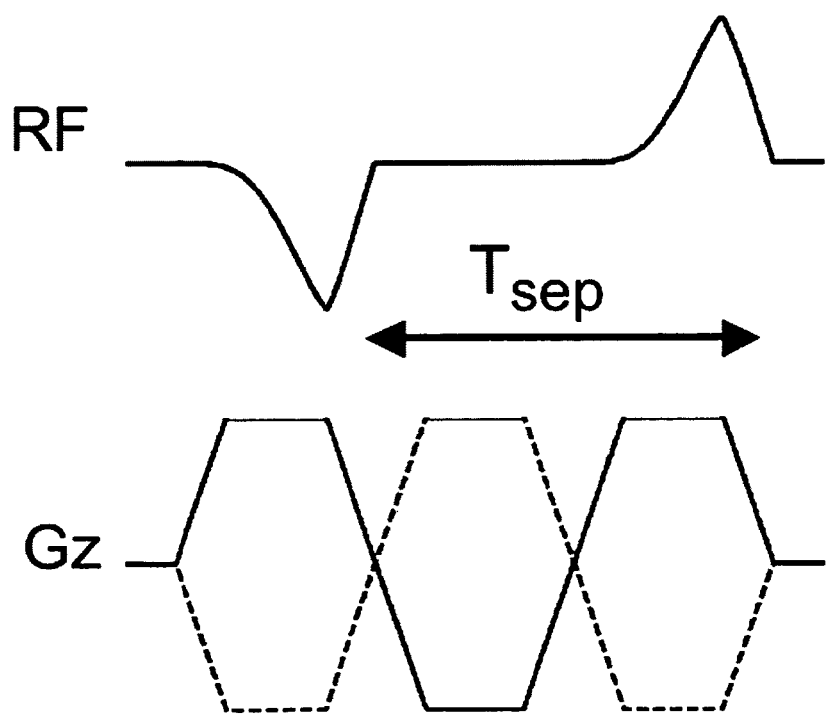
FIG. 2 shows an Inverted Double Half RF (IDHRF) pulse and slice select gradient.

Inverted Double Half RF Pulse:

A modification of the double half pulse that provides long $T_2$ suppression while exciting the short $T_2$ is also provided by an embodiment of the invention. This pulse is called the Inverted Double Half RF (IDHRF) pulse. It consists of a pair of half pulses of opposite polarity in each excitation, as shown in FIG. 2, which shows the Inverted Double Half RF (IDHRF) pulse and slice select gradient. The short $T_2$ behavior is the same as for the DHRF and for half pulses. Each excitation produces a half-sinc weighting in k-space for short $T_2$. However the preceding opposite polarity half pulse is seen by long $T_2$ spins, resulting in zero flip angle. Again, two excitations with opposite slice select gradient polarity are added to get the final signal.

In each excitation, the long $T_2$ gets tipped by the first half pulse, has negligible decay in the time interval and then gets tipped back to Mz (longitudinal axis) by the second half. However for the short $T_2$ spins, as before, the pulse amplitude is modulated by $T_2$ decay, and the result is a half-sinc weighting in k-space for a single excitation.

Slice Profile Simulation:

A Bloch equation simulation was performed in Matlab using each of the RF waveforms to estimate the slice profiles as a function of $T_2$. The simulation results are shown for two sets of $T_2$, $T_1$ decay values—$T_2$=1 ms, $T_1$=100 ms; $T_2$=100 ms, $T_1$=800 ms. The Half RF pulse was designed using a windowed sinc of TBW=2, with duration of 1.2 ms and a flip angle of 30 degrees.

Experiments:

All experiments were performed on a 0.5 T GE Signa SP interventional MR scanner (maximum gradient amplitude=1.2 G/cm, maximum slew rate=1.6 G/cm/ms). A 2D UTE pulse sequence with radial acquisition and ramp sampling was used to achieve a minimum TE of 100 μs (limited by hardware switching time). The echo time TE is defined here as the interval between the end of RF and beginning of data acquisition. The Half RF pulse was designed using (half of) a windowed sinc of TBW=2, and had a duration of 1.2 ms and a flip of 30° for combined excitation. The DHRF pulse duration was 6 ms, while IDHRF pulse duration was 4.6 ms. While other published work included characterization and compensation for eddy currents, no additional eddy current compensation besides that performed routinely on the scanner was done in these sets of experiments. The delay between the RF and gradients was tuned so that the excitation k-space weighting of the two halves in a single excitation was aligned.

A spherical doped water phantom with a long $T_2$=100 ms was imaged. The slice profile was measured by imaging with frequency encoding in the slice select direction. The free induction decay (FID) signal was also measured. The half pulse was compared to the double half pulse and to the Inverted Double Half pulse.

A phantom was built with $T_2$ values ranging between 0.4-20 ms using agar gel mixed with CuSO4 or MnCl2. This short $T_2$ phantom was imaged, placed next to a long $T_2$ sphere for all three RF pulses. To demonstrate the problem of out of slice signal due to eddy current distortions corrupting $R_2^*$ measurements, the short $T_2$ phantom was also imaged with a long $T_2$ phantom (a cylinder with doped water) placed next to it in the slice select direction. A slice close to the edge of the short $T_2$ phantom was imaged, so that there was long $T_2$ signal close to, but outside the slice. $R_2^*$ maps were obtained from images at echo times of 0.1, 0.4, 0.7, and 1.0 ms on a pixel-by-pixel basis.

Off-Resonance Simulation:

Off-resonance effects are generally benign for short $T_2$, but affect the long $T_2$ profiles. To understand the effect of phase accumulation during $T_{sep}$ interval on the signal, the profile of the pulses was simulated in presence of off-resonance. Simulation parameters were –$T_2$=100 ms, $T_1$=800 ms, and off-resonance frequencies ranging between ±200 Hz.

Results

Figure 3:
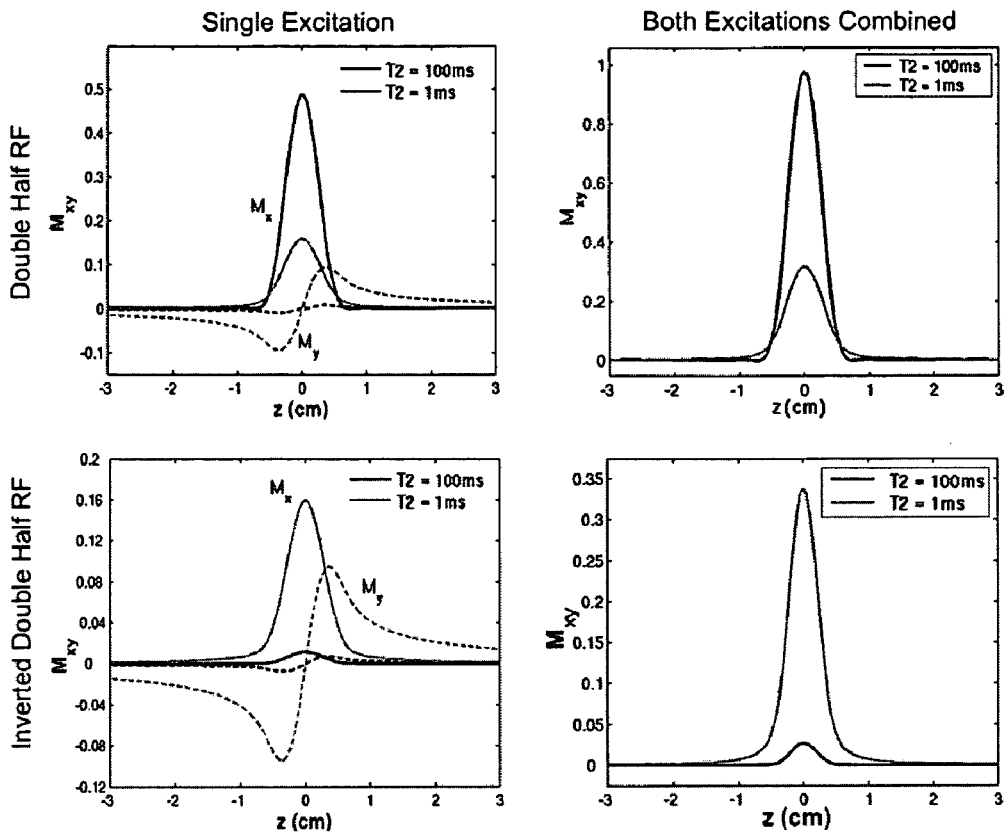
FIG. 3 shows simulated real and imaginary (solid line=Mx, dotted line=My) components of the slice profile for the Double Half RF (DHRF) and the Inverted Double Half RF (IDHRF) pulse.

Slice Profile Simulation:

FIG. 3 shows the simulated real and imaginary (solid line=Mx, dotted line=My) components of the slice profile for the Double Half RF (DHRF) and the Inverted Double Half RF (IDHRF) pulse. For short $T_2$=1 ms, both DHRF and IDHRF have the same profile as the Half RF (not shown here). For long $T_2$=100 ms, DHRF has a more selective profile and higher signal in each excitation. The IDHRF suppresses the long $T_2$ magnetization. The DHRF has higher signal and a more selective profile for long $T_2$ (in each excitation), while with the IDHRF the long $T_2$ signal is suppressed compared to short $T_2$. For the short $T_2$, both pulses provide similar signal levels as the Half RF pulse.

Figure 4:
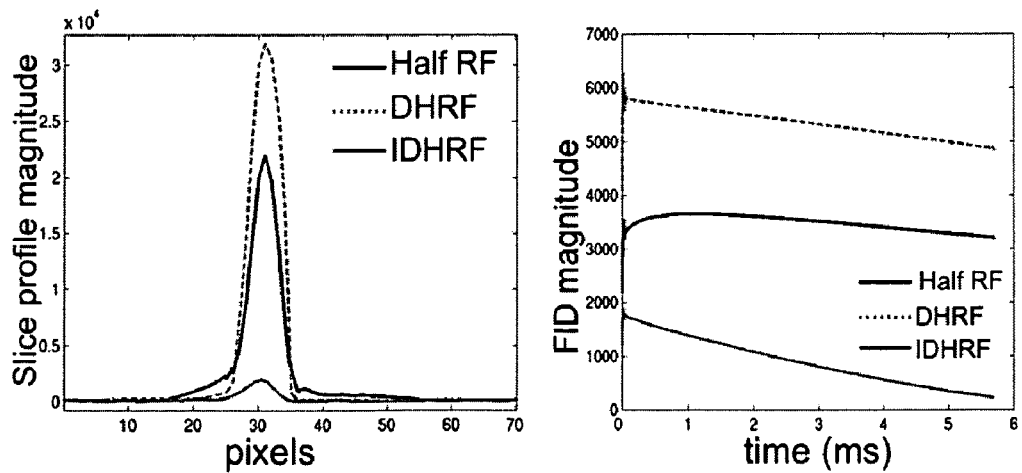
FIG. 4 shows that the Half RF pulse slice profile has tails that extend beyond the desired slice.

Experiments:

The measured slice profiles magnitudes (left) and associated FIDs (right) for a phantom with a $T_2$ of 100 ms in FIG. 4, show that the Half RF pulse slice profile has tails that extend beyond the desired slice. In the presence of eddy currents, residual gradients cause the slice selectivity of the half pulse to vary over time, so that the FID demonstrates an oscillatory behavior due to dephasing/rephasing of spins in the slice. The DHRF achieves much better slice selectivity, and its FID decays without oscillation. The IDHRF slice profile shows the long $T_2$ signal suppressed compared to half pulse. Compared to the half pulse, the FID for the IDHRF shows reduced signal and eliminates any oscillations. The DHRF pulse removes these errors and is much more selective. Oscillations in the FID from residual gradients due to eddy currents are eliminated with the DHRF and IDHRF.

Figure 5:
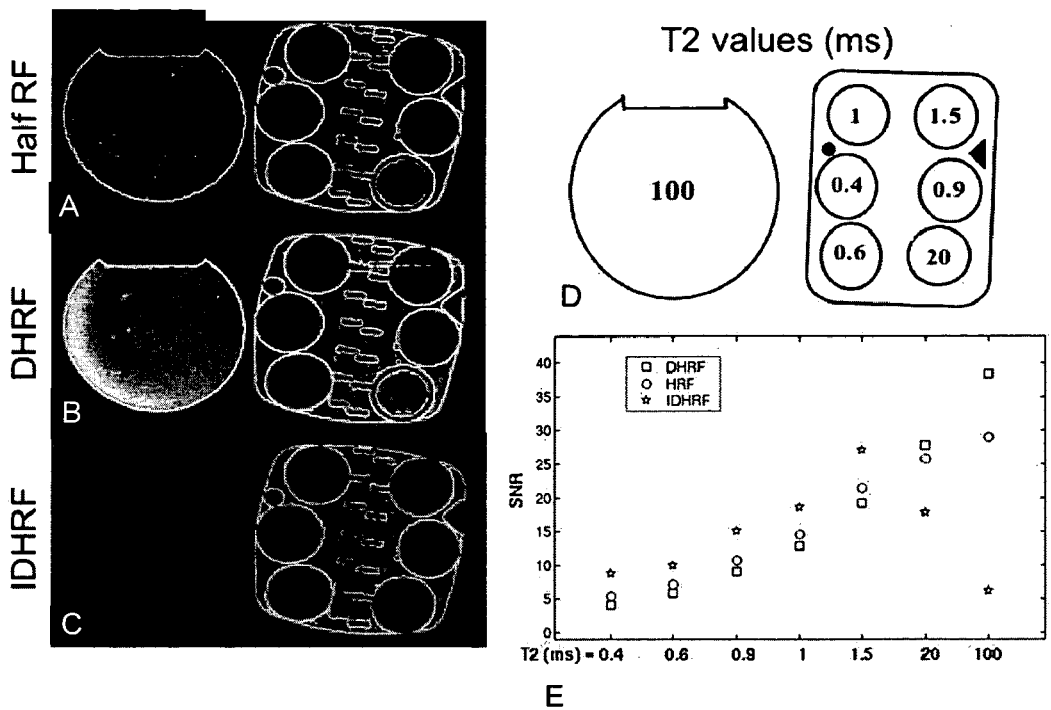
FIGS. 5A-E depict images of UTE phantom images.

FIG. 5 depicts images of UTE phantom images obtained with Half RF (FIG. 5A), Double Half RF (FIG. 5B), and Inverted Double Half RF pulse (FIG. 5C). A line diagram of the $T_2$ (ms) values in phantom is shown in FIG. 5D. SNR comparison for the three RF pulses, measured in the above images is shown in FIG. 5E. There is improved contrast for the shortest $T_2$ with IDHRF. TE=150 μs. The short $T_2$ phantom is placed next to a long $T_2$ sphere for the Half RF and both the Double Half RF pulses. The line drawing shows $T_2^*$ values measured in the phantom. The short $T_2$ phantom was imaged with a non-slice-selective excitation to avoid eddy current errors, and $T_2^*$ values were calculated from images taken at different echo times. With the double half pulse, the long $T_2$ appears bright as it experiences two full-sinc excitations. With the Inverted Double Half pulse, the long $T_2$ signal is suppressed, which improves contrast for shortest $T_2$. So, the shortest $T_2$ vial is better visualized in FIG. 5C. FIG. 5E plots the SNR of the different $T_2$ vials in these images. For the long $T_2$ vials, the DHRF pulse has the highest SNR as expected from the double excitation, while the IDHRF suppresses these. For short $T_2$ vials, IDHRF has better SNR than Half RF and DHRF, as the long $T_2$ suppression provides more dynamic range for short $T_2$ signals.

Figure 6:
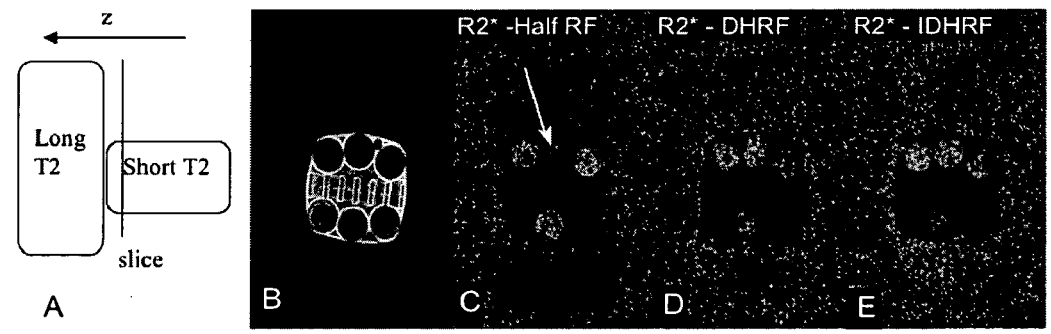
FIG. 6A shows a $T_2$ phantom setup in the presence of out-of-slice long $T_2$ signal.
FIG. 6B is a Half RF magnitude image.
FIG. 6C is an $R_2$* image with Half RF.
FIG. 6D shows an R2* image with Double Half RF.
FIG. 6E shows an R2* image with Inverted Double Half RF.
FIG. 6F shows $R_2$* values measured with the three pulses are compared to values measured with a hard non-selective pulse.
Figure 6:
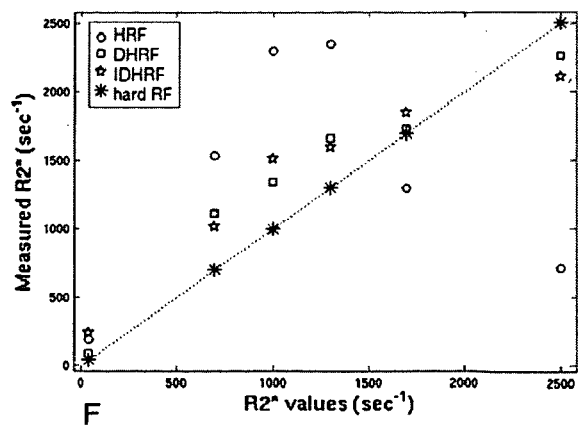

FIG. 6A shows a $T_2$ phantom setup in the presence of out-of-slice long $T_2$ signal. FIG. 6B is a Half RF magnitude image. FIG. 6C is an $R_2^*$ image with Half RF, where FIG. 6D shows an R2* image with Double Half RF, and FIG. 6E shows an R2* image with Inverted Double Half RF. The out of slice errors seen in the Half RF $R_2^*$ map are reduced in the other two cases. The arrow shows where out of slice long $T_2$ signal corrupts $R_2^*$ measurements. FIG. 6F shows $R_2^*$ values measured with the three pulses are compared to values measured with a hard non-selective pulse. Hard pulse $R_2^*$ measurements lie along the identity line. Each column is a different vial.

The magnitude image does not have apparent out-of-slice signal but the $R_2^*$ map for the half pulse shows significant signal outside the short $T_2$ phantom. It clearly demonstrates errors from out of slice long $T_2$ adding into the selected slice. The arrow marks where the out of slice long $T_2$ signal corrupts the $R_2^*$ measurement of the short $T_2$ vial. The out of slice signal is greatly reduced in the case of both the Double Half RF pulses, giving cleaner $R_2^*$ measurements. However off-resonance/shim artifacts can degrade the measurements, as seen by the residual signal in FIG. 6D and FIG. 6E. The $R_2^*$ values measured by non-selective excitation lie along the identity line. The Half RF measurements have obvious errors, while both the DHRF & IDHRF measurements are much closer to the hard pulse values.

Figure 7:
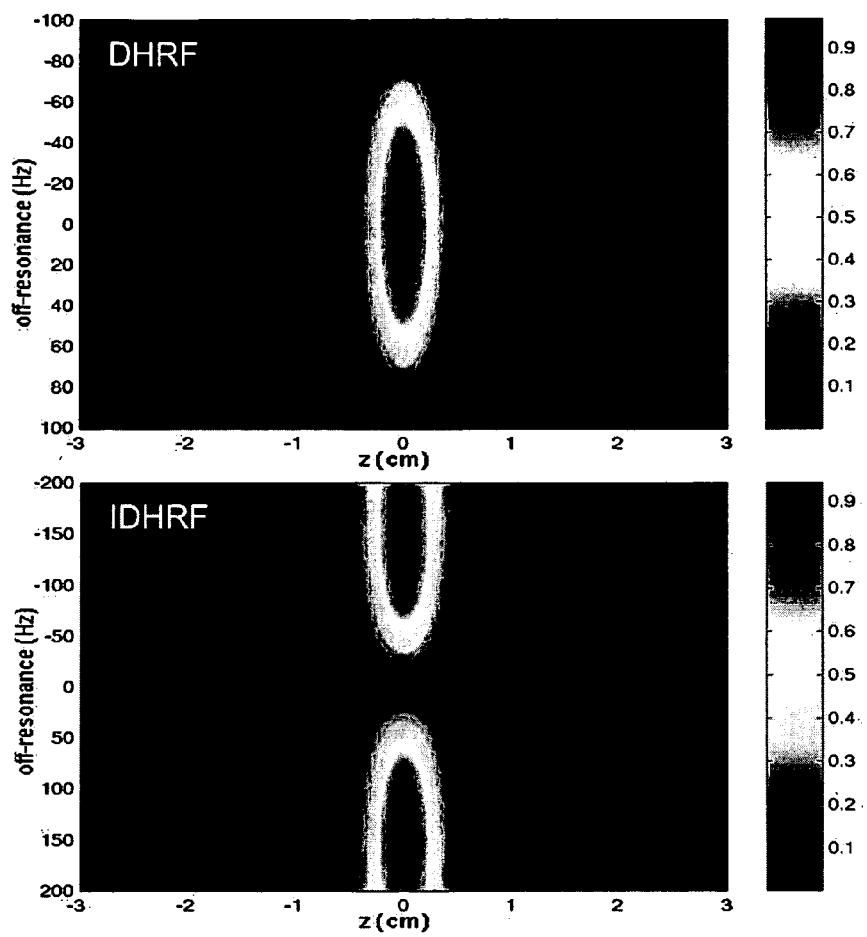
FIG. 7 shows the spectral-spatial profiles of off-resonance behavior of $M_{xy}$ Magnitude for both the double half pulses DHRF and IDHRF.

Off-Resonance Simulation:

The spectral-spatial profiles of off-resonance behavior of $M_{xy}$ Magnitude for both the double half pulses DHRF and IDHRF are shown in FIG. 7 (for $T_2$=100 ms, $T_1$=800 ms). The simulated profile is plotted for a range of off-resonance frequencies between ±200 Hz. Phase accumulation during the $T_{sep}$ interval results in a phase offset between the two halves in an excitation. On-resonance, the 2 halves of each excitation are "matched", i.e. they add for DHRF, and subtract for IDHRF. With off-resonance, they are not in phase anymore. The phase accumulated during $T_{sep}$ for off-resonant spins can lead to signal cancellation from the 2 halves for DHRF, but signal addition (i.e. loss of suppression) in case of the IDHRF pulse. For example, in case of one-half cycle of off-resonance during $T_{sep}$, the 2 halves are exactly 180° out of phase so there is signal cancellation for DHRF and addition for IDHRF. This can be useful for potentially suppressing fat in case of DHRF as shown in FIG. 8.

Figure 8:
FIG. 8 shows suppressing fat in case of DHRF.

FIG. 8 shows in vivo canine prostate images with the Double Half RF (left) and Half RF pulses (right). TE=200 µs. Arrows mark the location of cryoprobe needle artifact. The Double Half RF pulse image shows higher signal in the prostate tissue, while the fat is suppressed (arrowhead) as the off-resonance phase accumulation produces a 180° phase offset between the two half pulses.

For IDHRF, there is a tradeoff between sensitivity to off-resonance and signal from short $T_2$s. If $T_{sep}$ is long, off-resonance phase accumulation for long $T_2$ spins can be a problem. If $T_{sep}$ is too short, the short $T_2$ spins excited by the 1st half pulse get partially flipped back to $M_z$ by the 2nd half, resulting in reduced effective signal. For DHRF, short $T_{sep}$ is better for off-resonance immunity, and for short $T_2$ profile, but it provides less $M_z$ recovery for short $T_2$. Also, the minimum $T_{sep}$ is determined by the gradient area that needs to covered between the two half pulses. The pulses used in the above simulations can well tolerate off-resonance frequencies of up to ±30 Hz (which is acceptable for in vivo at 0.5 T), and that can be further improved by shorter pulse durations achievable with higher gradient amplitudes and slew rates (e.g. at 1.5 T closed bore scanners).

Figure 9:
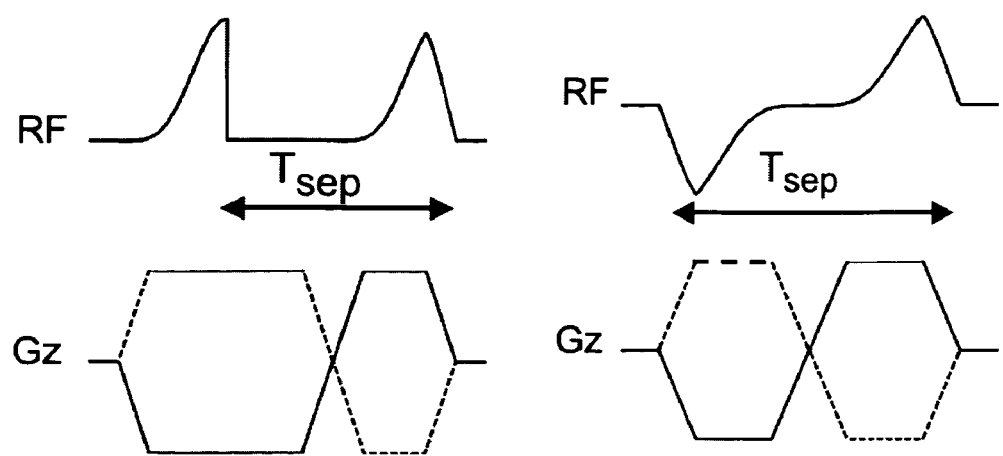
FIG. 9 shows alternate gradient designs for the DHRF (left) and IDHRF (right) that produce the same excitation k-space weighting.

Alternate Gradient Design:

The minimum $T_{sep}$ for both pulses is decided by the gradient trajectory and k-space that needs to be covered between the 2 half pulses. FIG. 9 shows alternate gradient designs for the DHRF (left) and IDHRF (right) that produce the same excitation k-space weighting. However, the various gradient trajectories have different off-resonance properties and eddy current behavior. For the DHRF pulse, the $T_{sep}$ interval for the gradient trajectory in FIG. 9 is shorter, which provides better off-resonance tolerance. However applying both the half pulses on the gradient ramp, as in FIG. 1, would be advantageous in reducing the slice profile distortion due to eddy currents. For the IDHRF pulse, the $T_{sep}$ is the same in both designs, so the off-resonance sensitivity is similar. However, the version in FIG. 2 plays both the half pulses on gradients of the same polarity, which would be more desirable for off-resonance immunity. The k-space traversal being in the same direction as the peaks of both pulses are applied also helps cancel the eddy current error/distortion better. Adding a pre-compensating negative gradient lobe before the slice-select would provide further benefit.

Discussion

UTE imaging with half pulse excitation is challenging as eddy currents cause distortion of the gradient waveform during and immediately after the RF pulse. This leads to improper weighting of excitation k-space and mismatch between the two acquisitions, resulting in out of slice contamination. This embodiment provides improved RF pulses that make short $T_2$ imaging and quantitation less sensitive to eddy currents. This is particularly important for quantitative applications, where $R_2$* measurements may be contaminated by out of slice signal due to eddy current distortions.

The double half pulse improves the slice selectivity for the long $T_2$ components for each excitation, so that imperfect cancellation of signal from out of slice long $T_2$ components does not contribute to the signal. Errors between the two excitations e.g. phase offset from $B_0$ eddy currents can still exist. But since each excitation is more selective, this error is not as problematic. The DHRF pulse does make contrast for short $T_2$ more difficult than the half pulse, as the long $T_2$ has more signal than the half pulse case.

The Inverted Double Half pulse achieves similar improvement by suppressing the long $T_2$. In addition, suppressing the large signal from the long $T_2$ components can significantly improve the dynamic range and contrast for the short $T_2$ components. The IDHRF pulse is much shorter than the long $T_2$ suppression pulses generally used, and preserves the short $T_2$ magnetization better. The IDHRF pulse does not saturate long $T_2$ signal, rather it restores long $T_2$ magnetization to longitudinal axis after excitation/perturbation. So $T_1$ recovery during the preparation and imaging pulse (i.e. Tsep) interval is not a problem (especially with short Tsep durations).

The performance of these pulses is enhanced with calibration of timing delays of the gradients and RF, and a good shim. These pulses provide excellent improvement in slice profile and selectivity for long $T_2$s that are much longer than pulse duration. For medium-range $T_2$s (on the order of pulse duration) that experience some $T_2$ decay between the two halves, there will be partial improvement in profile i.e. partially better selectivity for DHRF, and partial suppression for IDHRF. These pulses modify the profile of the long $T_2$ spins compared to the half pulse, while the short $T_2$ behavior is identical to the half pulse. However since usually the short $T_2$ is a minority, the major error comes from the long $T_2$ signal overwhelming the short $T_2$ signal. Thus, improving the long $T_2$ profile, results in a significant improvement.

An embodiment of the invention provides an application of these pulses on the 0.5 T interventional scanner, but these pulses would be similarly useful at higher field strength. With the higher gradient amplitudes and greater off-resonance frequencies present at higher field strength scanners, the $T_{sep}$ interval vs. off-resonance sensitivity would remain similar at 1.5 T, though it might be challenging at 3 T.

The pulses presented in embodiments of the invention demonstrate an improved excitation profile for imaging short $T_2$ tissues in the presence of eddy currents. They provide an effective alternative to the time-consuming gradient characterization and compensation techniques, and can be especially useful for quantitation of short $T_2$s.

Generalized Process

Figure 10:
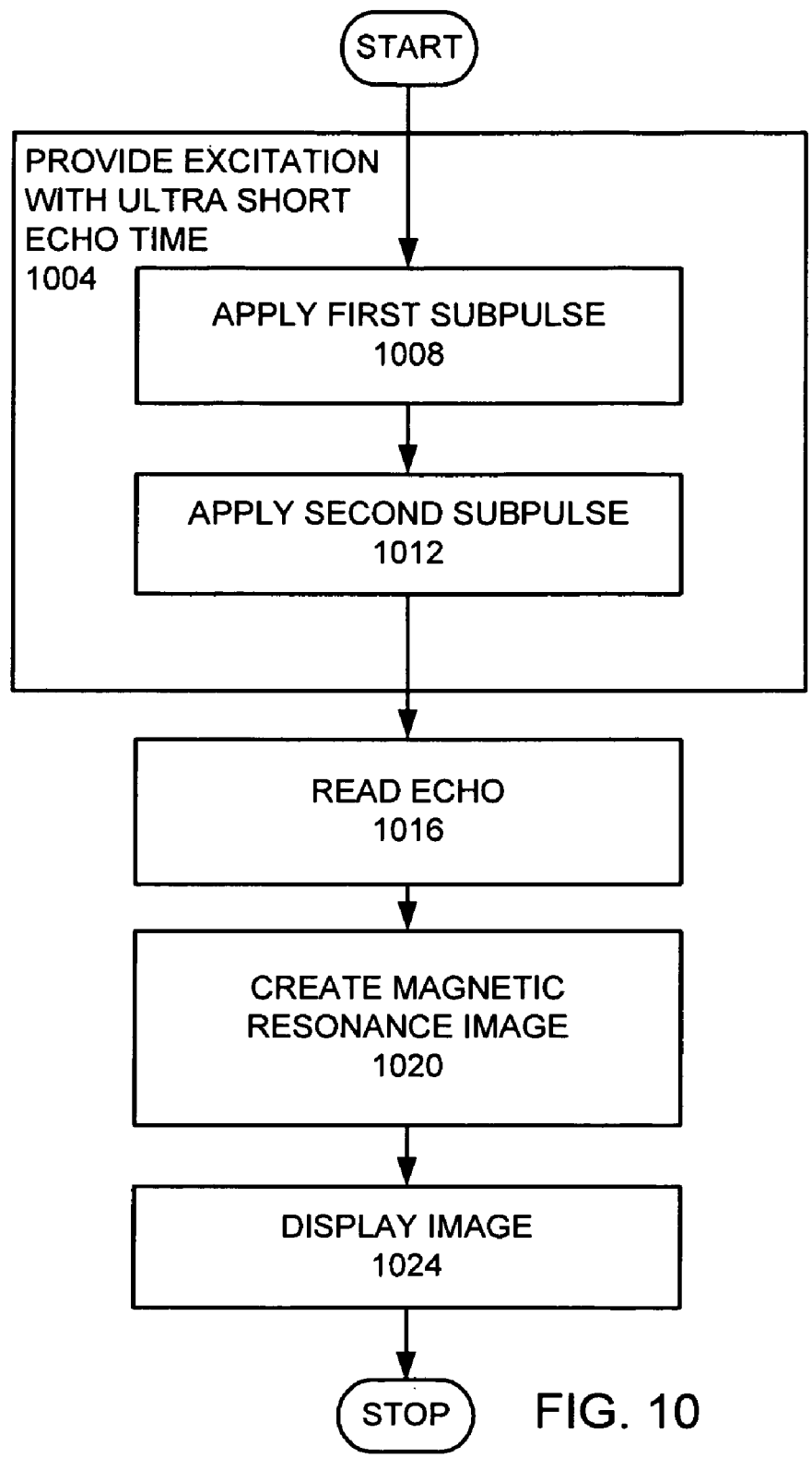
FIG. 10 is a high level flow chart of an embodiment of the invention.

To facilitate understanding, FIG. 10 is a high level flow chart of an embodiment of the invention, which provides a magnetic resonance image of an object with at least a first species and a second species, where the first species has a first $T_2$ time and the second species has a second $T_2$ time longer than the first T2 time. An excitation is provided with an ultra short echo time using a pulse (step 1004), which comprises a first subpulse that creates a transverse magnetization component of the first species and the second species (step 1008) and a second subpulse that creates a transverse magnetization for the first species and substantially returns the second species to a longitudinal axis, wherein the transverse magnetization component for the first species substantially decays for the first species during an interval between the first subpulse and the second subpulse (step 1012). Substantially means more than 50%. In one embodiment, the first subpulse may flip the first species and the second species to the transverse plane and the second subpulse may flip the first species to the transverse plane and flips the second species to the longitudinal axis. Preferably, the first subpulse has a first peak of a first polarity and the second subpulse with a peak at a second polarity opposite the first polarity. More preferably, the excitation is a Inverted Double Half RF pulse. More preferably, the first peak and second peak have a time difference that determines signal level based on the first $T_2$ time and the second $T_2$ time. Preferably, this excitation provides a slice selective gradient. At least one echo is read out (step 1016). A magnetic resonance image is created from the at least one echo (step 1020). Preferably, the created image has suppression of the second species. The image is displayed on a display (step 1024).

Figure 11:
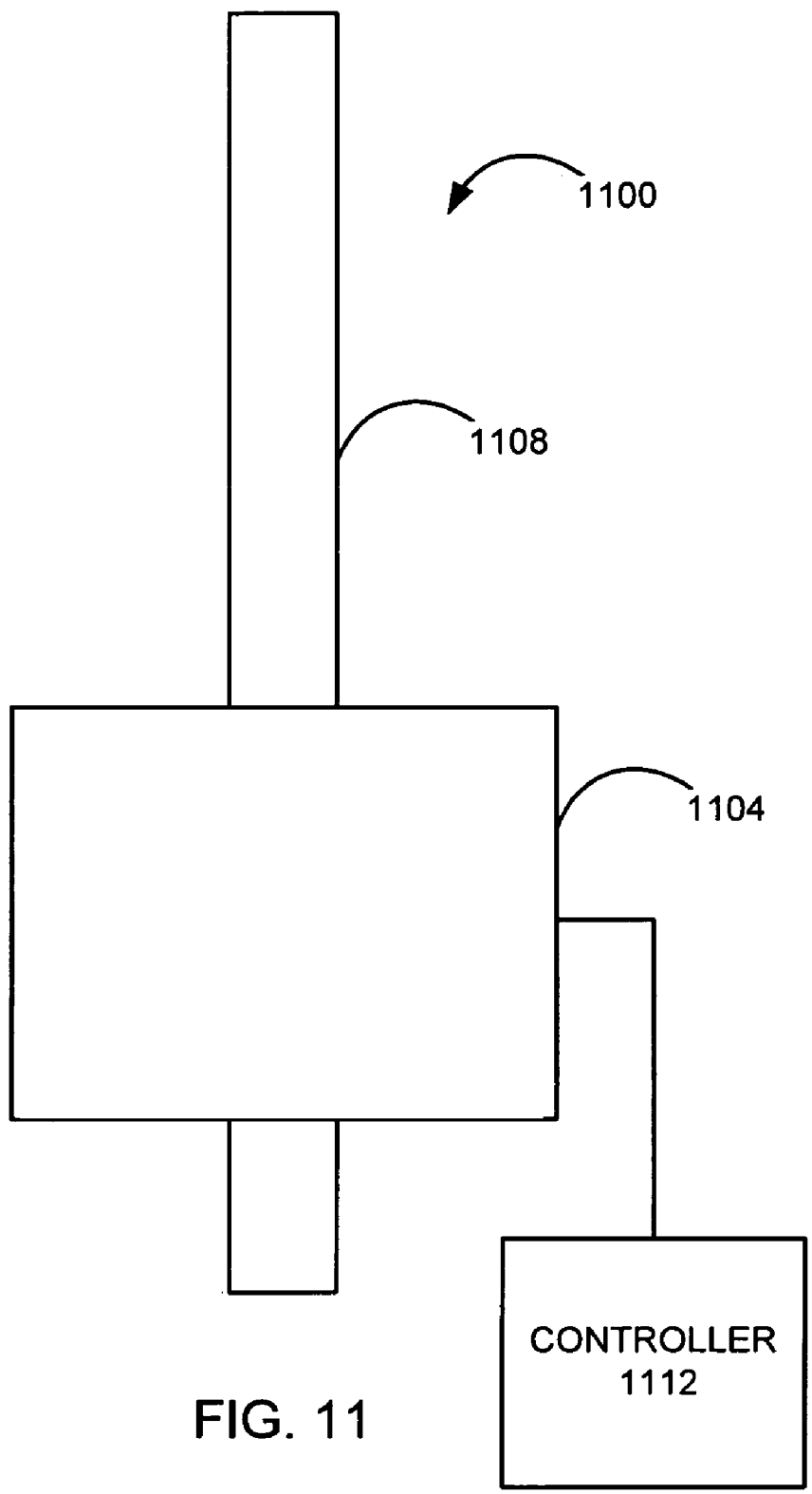
FIG. 11 is a schematic top view of a magnetic resonance imaging (MRI) system that may be used in an embodiment of the invention.

FIG. 11 is a schematic top view of a magnetic resonance imaging (MRI) system 1100 that may be used in an embodiment of the invention. The MRI system 1100 comprises a magnet system 1104, a patient transport table 1108 connected to the magnet system 1104, and a controller 1112 controllably connected to the magnet system 1104. In one example, a patient would lie on the patient transport table 1108 and the magnet system 1104 would pass around the patient. The controller 1112 would control magnetic fields and radio frequency (RF) signals provided by the magnet system 1104 and would receive signals from detectors in the magnet system 1104. In one embodiment, the magnet system 1104 would use a single excitation coil to excitation. In another embodiment, the magnet system 1104 would use multiple excitation coils to provide excitation.

Figure 12A:
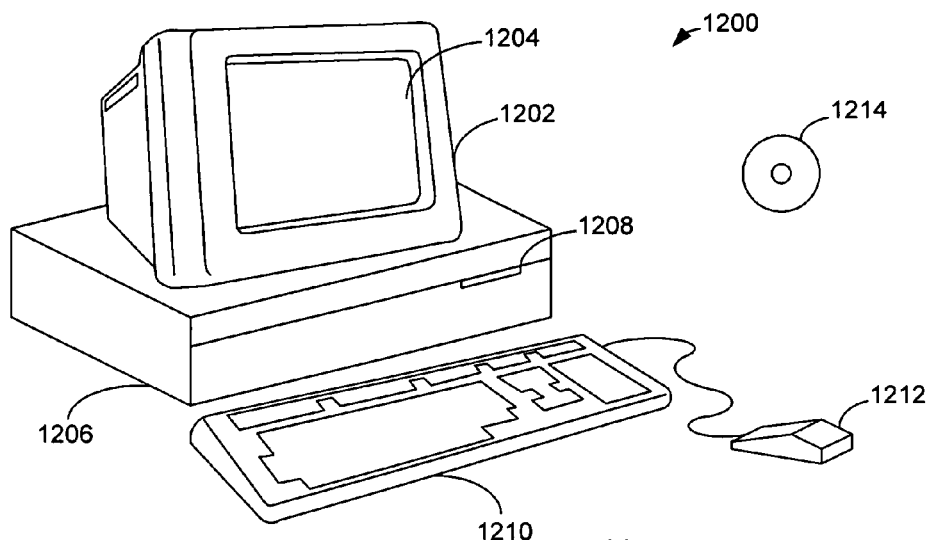
FIGS. 12A and 12B illustrate a computer system that may be used in an embodiment of the invention.
Figure 12B:
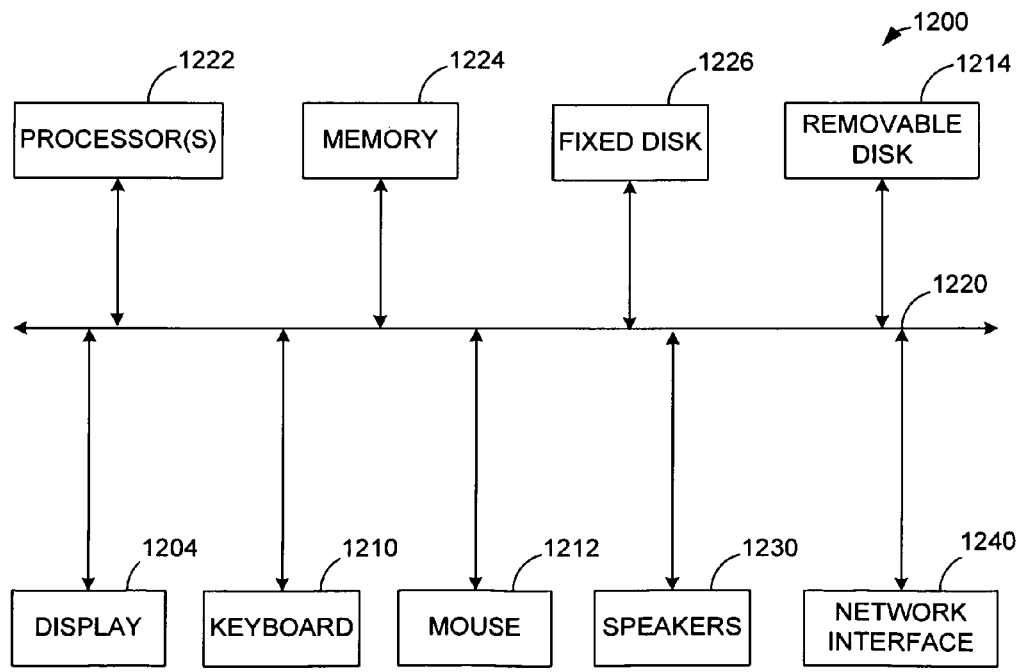

FIGS. 12A and 12B illustrate a computer system 1200, which is suitable for implementing a controller 1112 used in embodiments of the present invention. FIG. 12A shows one possible physical form of the computer system. Of course, the computer system may have many physical forms ranging from an integrated circuit, a printed circuit board, and a small handheld device up to a huge super computer. Computer system 1200 includes a monitor 1202, a display 1204, a housing 1206, a disk drive 1208, a keyboard 1210, and a mouse 1212. Disk 1214 is a computer-readable medium used to transfer data to and from computer system 1200.

FIG. 12B is an example of a block diagram for computer system 1200. Attached to system bus 1220 are a wide variety of subsystems. Processor(s) 1222 (also referred to as central processing units, or CPUs) are coupled to storage devices, including memory 1224. Memory 1224 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable kind of the computer-readable media described below. A fixed disk 1226 is also coupled bi-directionally to CPU 1222; it provides additional data storage capacity and may also include any of the computer-readable media described below. Fixed disk 1226 may be used to store programs, data, and the like and is typically a secondary storage medium (such as a hard disk) that is slower than primary storage. It will be appreciated that the information retained within fixed disk 1226 may, in appropriate cases, be incorporated in standard fashion as virtual memory in memory 1224. Removable disk 1214 may take the form of the computer-readable media described below.

CPU 1222 is also coupled to a variety of input/output devices, such as display 1204, keyboard 1210, mouse 1212, and speakers 1230. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1222 optionally may be coupled to another computer or telecommunications network using network interface 1240. With such a network interface, it is contemplated that the CPU might receive information from the network, or might output information to the network in the course of performing the above-described method steps. Furthermore, method embodiments of the present invention may execute solely upon CPU 1222 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In this example, the controller 1112 may be used to generate and then display an image on the display 1204.

This embodiment also provides ultra short TE with long $T_2$ suppression to provided short $T_2$ and long $T_2$ contrast. This embodiment provides profiles that are less sensitive to eddy currents, since the long $T_2$ is suppressed.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for creating a magnetic resonance image of an object with at least a first species and a second species, wherein the first species has a first $T_2$ time and the second species has a second $T_2$ time longer than the first $T_2$ time, comprising:

providing an excitation with an ultra short echo time using a pulse, comprising;

a first subpulse that creates a transverse magnetization component for the first species and the second species; and a second subpulse that creates a transverse magnetization for the first species and substantially returns the second species to a longitudinal axis, wherein the transverse magnetization component substantially decays for the first species during an interval between the first subpulse and the second subpulse;

reading at least one echo; and creating a magnetic resonance image from the at least one echo.

2. The method, as recited in claim 1, wherein the first subpulse has a first peak of a first polarity and the second subpulse has a peak at a second polarity opposite the first polarity.

3. The method, as recited in claim 2, wherein the first peak and the second peak have a time difference that determines a signal level based on the first $T_2$ and the second $T_2$.

4. The method as recited in claim 3, wherein the excitation provides a slice-selective gradient.

5. The method as recited in claim 4, wherein the created magnetic resonance image has suppression of the second species.

6. The method as recited in claim 5, wherein the excitation is an Inverted Double Half RF pulse.

7. The method, as recited in claim 6, wherein the first subpulse and the second subpulse form an Inverted Double Half RF pulse.

8. The method as recited in claim 7, wherein providing the excitation further comprises providing a shim, wherein the shim and the second polarity opposite the first polarity reduce eddy current distortion.

9. The method, as recited in claim 8, wherein the first subpulse is a 90° pulse, wherein the first subpulse flips the first species and the second species to the transverse plane and wherein the second subpulse flips the first species to the transverse plane and the second species to the longitudinal axis.

10. The method as recited in claim 1, wherein the excitation provides a slice-selective gradient.

11. The method as recited in claim 1, wherein the created magnetic resonance image has suppression of the second species.

12. The method as recited in claim 1, wherein the excitation is an Inverted Double Half RF pulse.

13. The method, as recited in claim 6, wherein the first subpulse and the second subpulse form an Inverted Double Half RF pulse.

14. The method as recited in claim 1, wherein the providing the excitation further comprises providing a shim, wherein the shim and the second polarity opposite the first polarity reduce eddy current distortion.

15. The method, as recited in claim 1, wherein the first subpulse is a 90° pulse, wherein the first subpulse flips the first species and the second species to the transverse plane and wherein the second subpulse flips the first species to the transverse plane and the second species to the longitudinal axis.

16. A magnetic resonance imaging apparatus, comprising:

a magnetic resonance imaging excitation and detection system; and a controller electrically connected to the magnetic resonance imaging excitation and detection system, comprising:

a display;

at least one processor; and computer readable media with computer readable code operable to be executed by the controller, comprising:

computer readable code for providing an excitation with an ultra short echo time using a pulse, comprising;

a first subpulse that creates a transverse magnetization component for the first species and the second species; and a second subpulse that creates a transverse magnetization for the first species and substantially returns the second species to a longitudinal axis, wherein the transverse magnetization component substantially decays for the first species during an interval between the first subpulse and the second subpulse;

computer readable code for reading at least one echo;

computer readable code for creating an magnetic resonance image from the at least one echo; and computer readable code for displaying the image on the display.

17. The apparatus, as recited in claim 16, wherein the first subpulse has a first peak of a first polarity and the second subpulse has a peak at a second polarity opposite the first polarity.

18. The apparatus, as recited in claim 17, wherein the first peak and the second peak have a time difference that determines a signal level based on the first $T_2$ and the second $T_2$.

19. The apparatus, as recited in claim 18, wherein the first subpulse and the second subpulse form an Inverted Double Half RF pulse.

* * * * *